United States Patent
Ji et al.

(10) Patent No.: US 11,551,924 B2
(45) Date of Patent: Jan. 10, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Shiliang Ji, Shanghai (CN); Bo Su, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 65 days.

(21) Appl. No.: 16/935,561

(22) Filed: Jul. 22, 2020

(65) Prior Publication Data
US 2021/0028007 A1    Jan. 28, 2021

(30) Foreign Application Priority Data
Jul. 22, 2019  (CN) .......................... 201910662591.1

(51) Int. Cl.
*H01L 21/02* (2006.01)
*H01L 21/3213* (2006.01)
*H01L 29/66* (2006.01)

(52) U.S. Cl.
CPC .. *H01L 21/02068* (2013.01); *H01L 21/32139* (2013.01); *H01L 29/66545* (2013.01)

(58) Field of Classification Search
CPC ......... H01L 21/02068; H01L 21/32139; H01L 29/66545
See application file for complete search history.

(56) References Cited

U.S. PATENT DOCUMENTS

| 10,847,636 | B2 * | 11/2020 | Tsai ................... H01L 29/66545 |
| 2009/0155977 | A1 * | 6/2009 | Han .................. H01L 21/28035 257/E21.546 |
| 2010/0252882 | A1 * | 10/2010 | Denison .............. H01L 29/0865 257/337 |
| 2015/0021681 | A1 * | 1/2015 | Hou ...................... H01L 29/517 257/330 |
| 2015/0035152 | A1 * | 2/2015 | Zhou ................. H01L 23/53295 438/653 |
| 2015/0171098 | A1 * | 6/2015 | Simsek-Ege ....... H01L 27/11556 438/588 |
| 2018/0096952 | A1 * | 4/2018 | Miccoli ................. H01L 23/562 |
| 2019/0273147 | A1 * | 9/2019 | Cheng ............... H01L 21/76814 |
| 2019/0371612 | A1 * | 12/2019 | Xue .................. H01L 21/02071 |
| 2020/0411384 | A1 * | 12/2020 | Chung ............ H01L 21/823431 |

* cited by examiner

*Primary Examiner* — Monica D Harrison
*Assistant Examiner* — Andre C Stevenson
(74) *Attorney, Agent, or Firm* — Anova Law Group, PLLC

(57) ABSTRACT

A method for forming a semiconductor structure includes providing a substrate; forming a gate structure on the substrate, the gate structure extending along a first direction; removing a portion of the gate structure to form a trench in the gate structure, the trench penetrating through the gate structure along a second direction which is different form the first direction; performing a first cleaning treatment process on the trench to remove non-metal residues; and performing a second cleaning treatment process on the trench to remove metal residues.

19 Claims, 7 Drawing Sheets

SEMICONDUCTOR STRUCTURE AND METHOD FOR FORMING THE SAME

CROSS-REFERENCE TO RELATED APPLICATION

This application claims priority to Chinese Patent Application No. 201910662591.1, filed on Jul. 22, 2019, the entire content of which is incorporated herein by reference.

TECHNICAL FIELD

The present disclosure relates to the field of semiconductor manufacturing and, more particularly, relates to a semiconductor structure and a method for forming the same.

BACKGROUND

The electronics industry has experienced an increasing demand for smaller and faster electronics devices. These smaller and faster electronics devices can simultaneously provide a greater number of increasingly complex and cutting-edge functions. Therefore, the continuing trend in the semiconductor industry is to manufacture low-cost, high-performance, and low-power integrated circuits (ICs). At present, these goals have been achieved to a large extent by scaling down the feature size of semiconductor ICs (e.g., the minimum feature size of critical dimension, CD) and thereby improving production efficiency and reducing related costs. However, the scaling down of the size of semiconductor ICs also increases the complexity of the semiconductor manufacturing process. Therefore, the realization of continuous advancements in semiconductor ICs and devices requires synchronous advances in semiconductor manufacturing processes and technologies.

A semiconductor device usually includes a gate, and the material of the gate essentially affects the electronic performance of the device. In traditional polycrystalline-silicon gate process, because the "polycrystalline-silicon depletion" effect may affect the conduction of the device, a metal gate is introduced. In order to obtain desired epitaxial stress, it is necessary to cut off the gate when the metal gate exceeds 5 nm and beyond. The process can not only obtain a desired profile, but also shrink the feature size by more than 20 nm. However, after the metal gate is cut off, the removal and clean of residues at the bottom of the trench becomes pretty challenging.

How to ensure that the residues can be effectively removed from the semiconductor structure after the metal gate is cut off, such that the yield of the final product may be improved, is an urgent problem that needs to be solved. The disclosed semiconductor structures and fabrication methods thereof are directed to solve one or more problems set forth above and other problems in the art.

SUMMARY

A problem to be addressed in embodiments and implementations of the present disclosure is to provide a semiconductor structure and a method to effectively remove the residues formed by metal gate cut process and therefore to improve the product yield.

One aspect of the present disclosure provides a method for forming a semiconductor structure. The method includes: providing a substrate; forming a gate structure on the substrate, the gate structure extending along a first direction; removing a portion of the gate structure to form a trench in the gate structure, the trench penetrating through the gate structure along a second direction that is different from the first direction; performing a first cleaning treatment process on the trench to remove non-metal residues; and performing a second cleaning treatment process on the trench to remove metal residues.

Optionally, the method further includes forming a dielectric layer on the substrate. The dielectric layer covers sidewall surfaces of the gate structure and exposes the top surface of the gate structure.

Optionally, the gate structure includes a gate layer and a sidewall spacer formed on each sidewall surface of the gate layer.

Optionally, the gate structure further includes a gate dielectric layer formed on the substrate. The gate layer is disposed on the gate dielectric layer, and the gate dielectric layer is made of a material including a high-K (K is the dielectric constant) dielectric material.

Optionally, the gate layer is made of a material including a metal, and the sidewall spacer is made of a material including silicon oxide ($SiO_x$), silicon nitride ($SiN_x$), silicon oxynitride (SiON), or a combination thereof.

Optionally, forming the dielectric layer and the gate structure includes forming a dummy gate layer; forming the sidewall spacer on the sidewall surface of the dummy gate layer; forming an initial dielectric layer on the substrate, the initial dielectric layer covering the dummy gate layer and the sidewall spacer; planarizing the initial dielectric layer until the dummy gate layer is exposed to form the dielectric layer; after forming the dielectric layer, removing the dummy gate layer to form a first opening; forming the gate dielectric layer on the bottom surface of the first opening; and forming the gate layer on the gate dielectric layer.

Optionally, forming the trench includes forming a mask structure on the dielectric layer and the gate structure, the mask structure exposing a portion of the gate structure; and etching the gate layer and the sidewall spacer using the mask structure as an etch mask to form the trench.

Optionally, the mask structure includes a first mask layer and a second mask layer disposed on the first mask layer; and the first mask layer and the second mask layer are made of different materials.

Optionally, the first mask layer is made of silicon oxycarbide (SiOC); and the second mask layer is made of titanium nitride (TiN), silicon carbide (SiC), silicon carbonitride (SiCN), silicon oxycarbonitride (SiCON), silicon oxynitride (SiON), boron nitride (BN), boron carbonitride (BCN), or a combination thereof.

Optionally, when forming the gate structure on the substrate, more than one gate structure is formed on the substrate, and each gate structure extends along the first direction. The trench penetrates through at least two gate structures.

Optionally, performing the first cleaning treatment process includes performing a plasma treatment process on the trench and subsequently performing a cleaning process on the trench.

Optionally, etching the sidewall spacer generates non-metal residues, including nitride, oxide, or a combination thereof; and etching the gate layer generates metal residues.

Optionally, the processing parameters used in the plasma treatment process include a processing gas including hydrogen ($H_2$) or helium (He) or argon (Ar); a gas flow rate in a range of approximately 10 sccm to 1000 sccm; a power in a range of approximately 50 W to 2000 W; a bias voltage in a range of 0 V to approximately 5000 V; and a processing temperature in a range of approximately 30° C. to 150° C.

Optionally, the cleaning process includes a SiCoNi process, and the processing parameters used in the SiCoNi process include a processing gas including nitrogen trifluoride ($NF_3$) or ammonia ($NH_3$), a gas flow rate in a range of approximately 100 sccm to 2000 sccm, and a processing temperature not higher than approximately 50° C.

Optionally, the second cleaning treatment process includes a dry cleaning process or a wet cleaning process.

Optionally, the second cleaning treatment process includes a dry cleaning process; and the processing parameters used in the dry cleaning process include a processing gas including carbon tetrafluoride ($CF_4$), sulfur hexafluoride ($SF_6$), boron trichloride ($BCl_3$), or a combination thereof, a gas flow rate in a range of approximately 5 sccm to 500 sccm, a power in a range of approximately 50 W to 1500 W, a bias voltage in a range of approximately 50 V to 2000 V, and a processing temperature not higher than approximately 150° C.

Optionally, the solution used in the wet cleaning process is a concentrated sulfuric acid ($H_2SO_4$) and/or hydrogen peroxide ($H_2O_2$).

Optionally, the second cleaning treatment process is performed after the first cleaning treatment process.

Optionally, after performing the first cleaning treatment process and the second cleaning treatment process, the method further includes forming an isolation layer in the trench. The isolation layer is made of a material including silicon oxide ($SiO_x$), silicon nitride ($SiN_x$), silicon oxynitride (SiON), a low-K dielectric material, an ultra-low-K (ULK) dielectric material, or a combination thereof.

Another aspect of the present disclosure provides a semiconductor structure formed by a method according to the present disclosure.

Compared to the existing technology, the technical solution of the present disclosure includes the following beneficial effects:

According to the disclosed methods and semiconductor structures, the trench is used to cut off the gate structure and reduce the feature size of the original gate structure to achieve a higher level of integration; the first cleaning treatment process removes non-metal residues formed in the trench; the second cleaning treatment process removes metal residues in the trench. Therefore, undesirable electrical connections between adjacent gate structures due to the metal residues at the bottom of the trench may be effectively avoided. As such, current leakage between adjacent gate structures may be reduced, and the electronic device performance and yield of the final product may be improved.

Further, the second cleaning treatment process is performed after performing the first cleaning treatment process. Through the first cleaning treatment process, the non-metal residues are removed, so that the metal residues can be substantially exposed in the trench, which is conducive to complete removal of the metal residues in the subsequently performed second cleaning treatment process. Therefore, the current leakage problem caused by the metal residues electrically connecting adjacent gate structures may be reduced, and thus the performance and yield of the final product may be improved.

Further, an isolation layer is formed in the trench after performing the first cleaning treatment process and the second cleaning treatment process. The purpose of forming the isolation layer is to fill the groove of the trench to prevent the metal residues from filling the groove of the trench again in subsequent processes. The metal residues filled again in the groove of the trench may cause an electrical current leakage problem as conductive paths are formed in the gate layer between the two sides of the trench. This deteriorates the electronic device performance and then reduces the yield of a final product.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

References will now be made in details to exemplary embodiments of the present disclosure, which are illustrated in the accompanying drawings. Wherever possible, the same reference numbers will be used throughout the drawings to refer to the same or like parts.

According to the existing technology, the performance and the production yield of the semiconductor structure may still need to be improved in a further way. In the following, further analysis and description will be made in combination with some examples.

Figure 1:
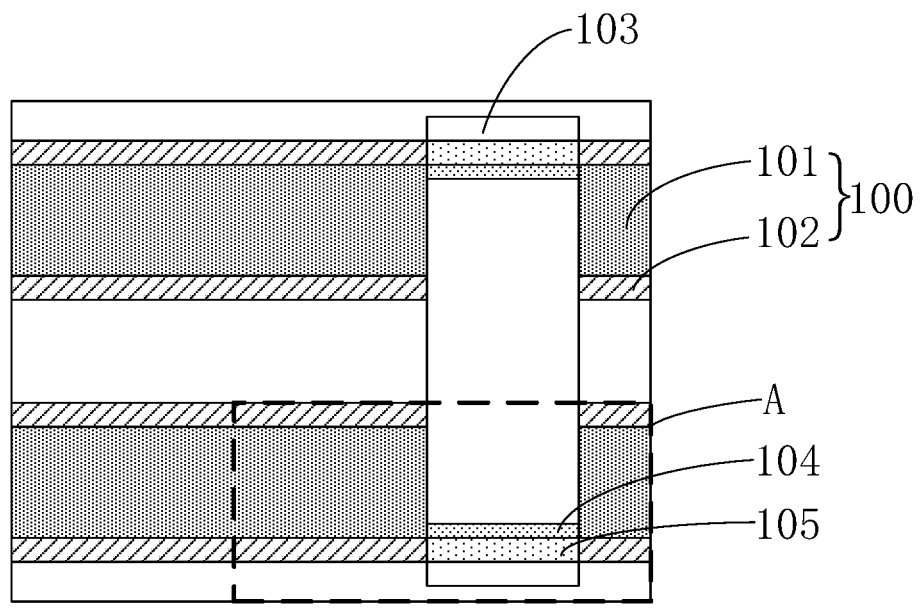
FIG. 1 to FIG. 2 illustrate schematic views of a semiconductor structure.
Figure 2:
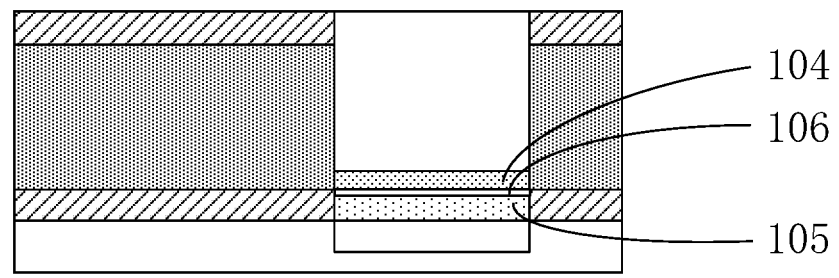

FIG. 1 and FIG. 2 illustrate schematic views of a semiconductor structure. Referring to FIG. 1, a substrate is provided, and two gate structures 100 and a dielectric layer (not shown) are formed on the substrate. The dielectric layer exposes the top surface of each gate structure 100, and the gate structure 100 extends along a first direction.

Each gate structure 100 includes a gate layer 101 and a sidewall spacer 102 formed on the sidewall surface of the gate layer 101. A first trench 103 is formed in the gate structure 100, and the first trench 103 penetrates through the gate structure 100 along a second direction. The second direction is different from the first direction. After forming the first trench 103, metal residues 104 and nitride residues 105 may remain on the bottom surface of the first trench 103.

FIG. 2 shows an enlarged schematic view of part A in FIG. 1. Referring to FIG. 2, the nitride residues 105 can be easily oxidized to form an oxide layer 106, and the oxide layer 106 can be easily removed by rinsing. After the oxide layer 106 is cleaned and removed, a second trench connecting the gate structure 100 on both sides of the first trench 103 is formed. The second trench may be easily filled with the metal residues 104. Therefore, a conductive path connecting the gate structure 100 on both sides of the first trench 103 is likely formed, thereby causing current leakage, which may further affect the final electronic device performance and yield of the final product.

The present disclosure provides a semiconductor structure and a method for forming the semiconductor structure. According to the disclosed method, a first cleaning treatment process is performed on the first trench to remove non-metal residues, and a second cleaning treatment process is performed on the first trench to remove metal residues. As such, the leakage problem caused by the metal residues connecting the gate structure on both sides of the first trench may be solved, and the electronic device performance and yield of the final product may be improved.

To make the aforementioned objectives, features, and beneficial effects of the present disclosure more comprehensible, specific embodiments of the present disclosure are described in detail with reference to the accompanying drawings.

Figure 11:
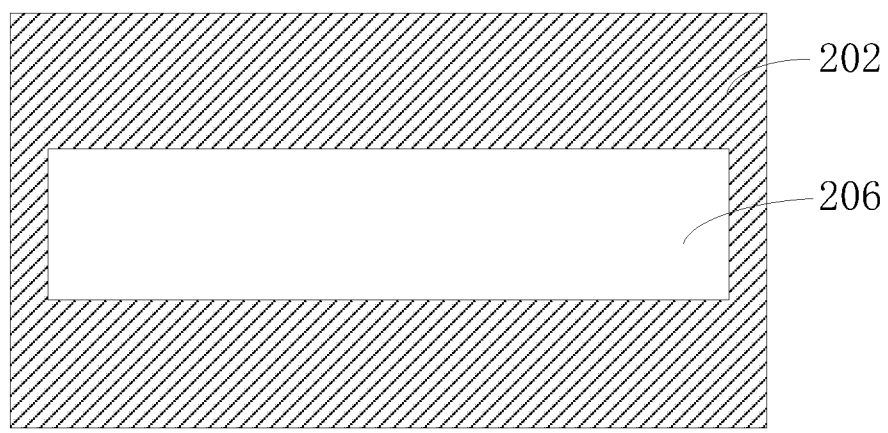
Figure 12:
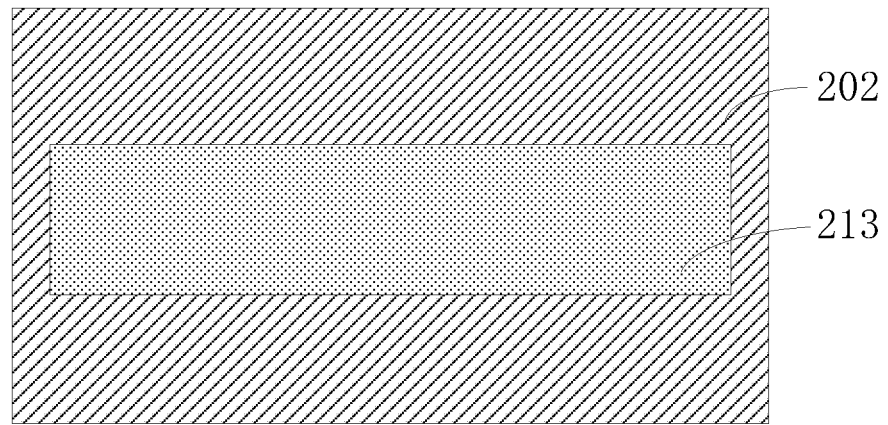
Figure 13:
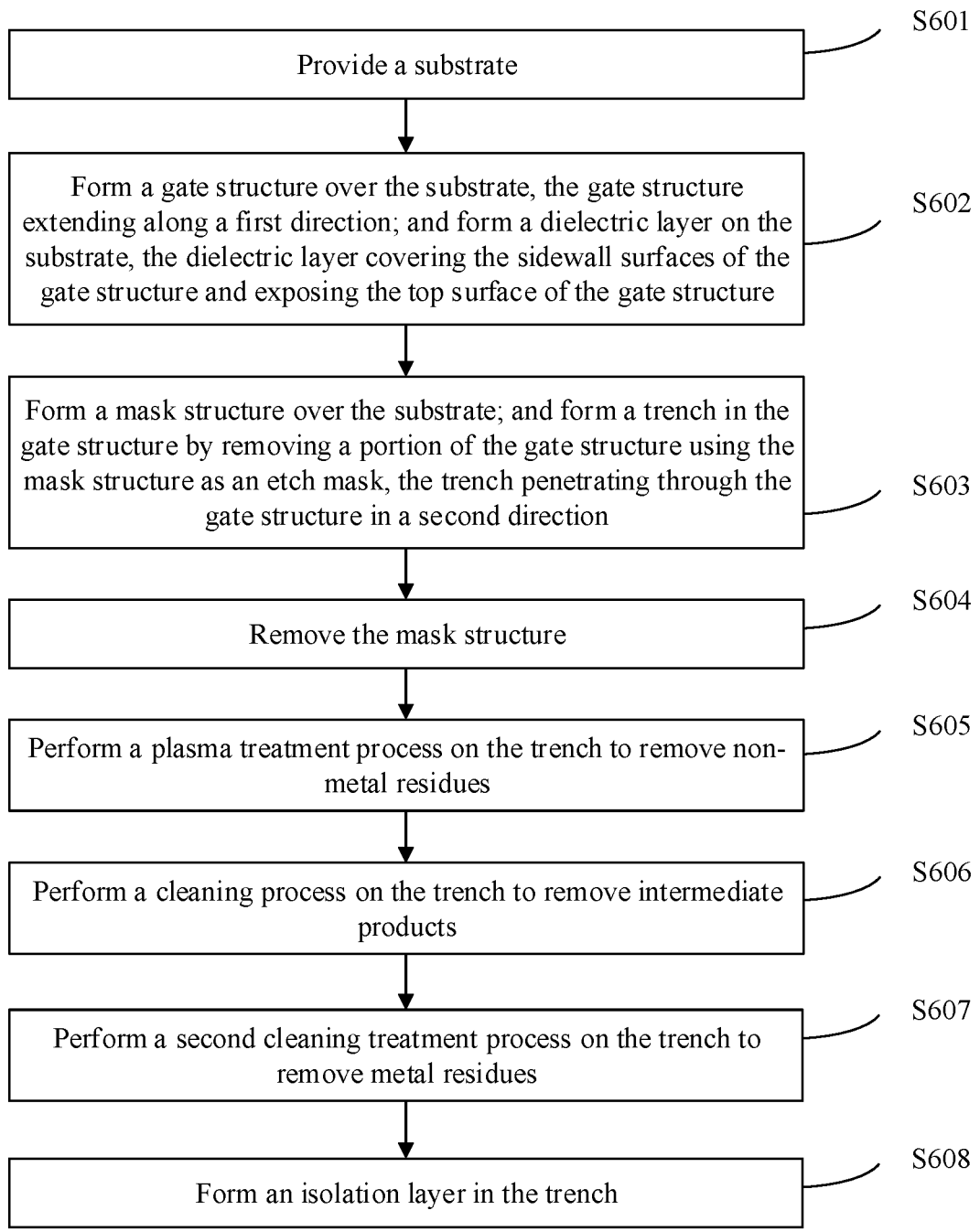
FIG. 13 illustrates a flowchart of an exemplary method for forming a semiconductor structure according to some embodiments in the present disclosure.

FIG. 13 illustrates a flowchart of an exemplary method for forming a semiconductor structure according to some embodiments in the present disclosure. FIG. 3 to FIG. 12 illustrate schematic views of semiconductor structures at certain stages of the exemplary fabrication method.

Figure 3:
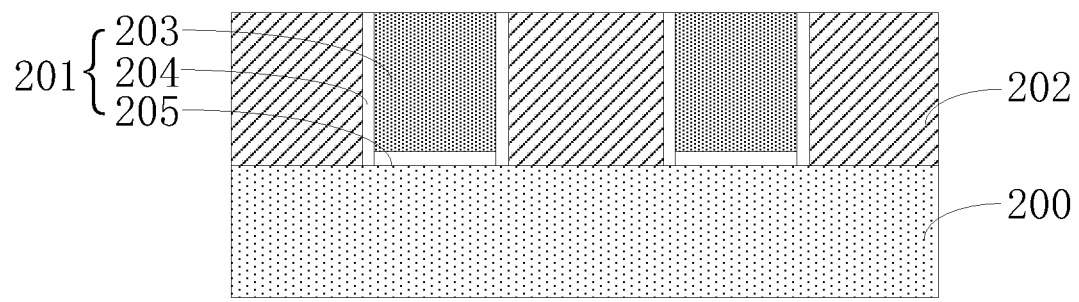
FIG. 3 to FIG. 12 illustrate schematic views of semiconductor structures at certain stages of an exemplary method for fabricating a semiconductor structure according to some embodiments in the present disclosure.

Referring to FIG. 13, in S601, a substrate may be provided. FIG. 3 illustrates a schematic view of a semiconductor structure according to some embodiments of the present disclosure.

Referring to FIG. 3, a substrate 200 may be provided. In one embodiment, the substrate 200 may be made of a material including silicon (Si). In other embodiments, the substrate may be made of a material including germanium (Ge), silicon germanium (SiGe), silicon carbide (SiC), gallium arsenide (GaAs), or indium arsenide (InAs). Alternatively, the substrate may have a composite structure, such as silicon on insulator (SOI), germanium on insulator (GOI), and the like.

Returning to FIG. 13, in S602, a gate structure may be formed on the substrate, the gate structure extending along a first direction; and a dielectric layer may be formed on the substrate, the dielectric layer covering the sidewall surfaces of the gate structure and exposing the top surface of the gate structure. The semiconductor structure shown in FIG. 3 includes the gate structure formed on the substrate and the dielectric layer.

Referring to FIG. 3, a gate structure 201 may be formed on the substrate 200, and the gate structure 201 may extend along a first direction. Further, a dielectric layer 202 may be formed on the substrate 200. The dielectric layer 202 may cover the sidewall surfaces of the gate structure 201 and may have a top surface leveled with the top surface of the gate structure 201. Therefore, the top surface of the gate structure 201 may be exposed by the dielectric layer 202.

The dielectric layer may be made of a material including silicon oxide ($SiO_2$), a low-K dielectric material (a low-K dielectric material refers to a dielectric material with a relative dielectric constant below 3.9), or an ultra-low-K dielectric material (an ultra-low-K dielectric material refers to a dielectric material with a relative dielectric constant below 2.5).

When the dielectric layer 202 is made of a low-K dielectric material or an ultra-low-K dielectric material, the material of the dielectric layer 202 may be carbosiloxyhydride (SiCOH), fluorosilicate glass (FSG), borosilicate glass (BSG), phosphosilicate glass (PSG), borophosphosilicate glass (BPSG), hydridosilsesquioxane, or methylsilsesquioxane.

In one embodiment, the dielectric layer 202 may be made of an ultra-low-K (ULK) dielectric material (with a dielectric constant below 2.5), and the ultra-low-K dielectric material may be SiCOH.

In one embodiment, the gate structure 201 may include a gate layer 203 and a sidewall spacer 204 formed on the sidewall surface of the gate layer 203. The gate layer 203 may be made of a material including a metal. The metal may include copper (Cu), tungsten (W), nickel (Ni), chromium (Cr), titanium (Ti), tantalum (Ta), aluminum (Al), and a combination thereof. In one embodiment, the gate layer 203 may be made of Al.

The sidewall spacer 204 may be made of a material including silicon oxide ($SiO_x$), silicon nitride ($SiN_x$), silicon oxynitride (SiON), or a combination thereof. In one embodiment, the sidewall spacer 204 may be made of silicon nitride.

In one embodiment, forming the sidewall spacer 204 may include a chemical vapor deposition (CVD) process. In other embodiments, forming the sidewall spacer 204 may include an atomic layer deposition (ALD) process, or a physical vapor deposition (PVD) process, In one embodiment, the gate structure 201 may further include a gate dielectric layer 205 formed on the substrate 200, and accordingly, the gate layer 203 may be disposed on the gate dielectric layer 205.

In one embodiment, the gate dielectric layer may be made of a high-k dielectric material. In other embodiments, the gate dielectric layer may be made of silicon oxide ($SiO_x$).

In one embodiment, forming the gate dielectric layer 205 may include a thermal oxide process. In other embodiments, forming the gate dielectric layer may include an in-situ steam generation (ISSG) process.

In one embodiment, the method for forming the dielectric layer 202 and the gate structure 201 may include: forming a dummy gate layer (not shown) on the substrate 200; forming a sidewall spacer 204 on the sidewall surface of the dummy gate layer; forming an initial dielectric layer (not shown) on the substrate 200, the initial dielectric layer covering the dummy gate layer and the sidewall spacer 204; planarizing the initial dielectric layer to expose the top surface of the dummy gate layer and thus form the dielectric layer 202; after the formation of the dielectric layer 202, removing the dummy gate layer to form a first opening; forming the gate dielectric layer 205 at the bottom surface of the first opening; forming a gate layer 203 on the gate dielectric layer 205.

In other embodiments, the method for forming the dielectric layer and the gate structure may further include: forming a gate dielectric layer on the substrate; forming a dummy gate layer (not shown) on the gate dielectric layer; forming the sidewall spacer on the sidewall surface of the dummy gate layer; forming an initial dielectric layer (not shown) on the substrate, the initial dielectric layer covering the gate dielectric layer, the dummy gate layer, and the sidewall spacer; planarizing the initial dielectric layer to expose the top surface of the dummy gate layer and thus form the dielectric layer; after the formation of the dielectric layer, removing the dummy gate layer to form a first opening; and forming the gate layer in the first opening, the gate layer located on the gate dielectric layer.

In one embodiment, the dummy gate layer may be made of polycrystalline silicon. Forming the initial dielectric layer may include a CVD process, a PVD process, an ALD process, or a spin coating process. In one embodiment, the initial dielectric layer may be formed by a CVD process.

In one embodiment, the initial dielectric layer may be planarized by a chemical mechanical polishing (CMP) process. In other embodiments, the initial dielectric layer may be planarized by an etching process.

In one embodiment, the dummy gate layer may be removed by a dry etching process. In other embodiments, the dummy gate layer may be removed by a plasma etching process or a wet etching process.

Figure 4:
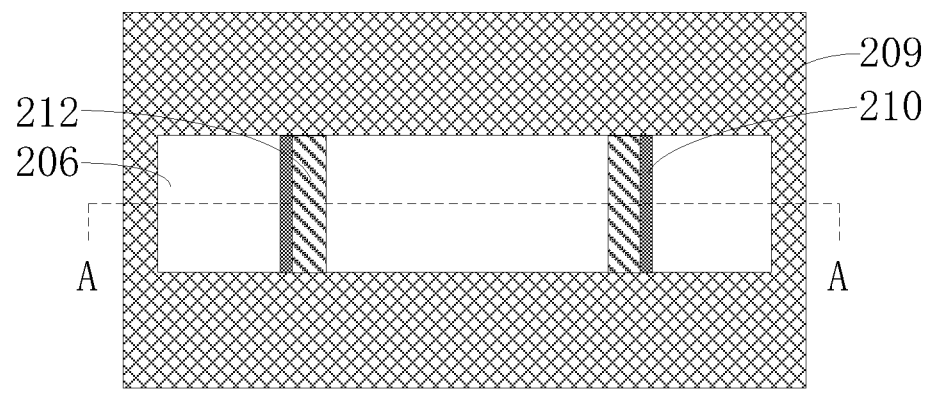
Figure 5:
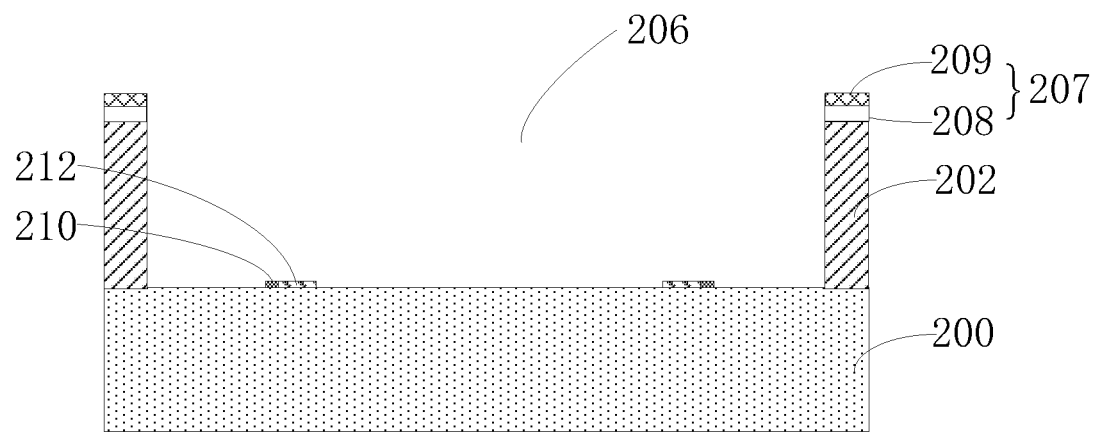

Further, returning to FIG. 13, in S603, a mask structure may be formed over the substrate, a trench may be formed in the gate structure by removing a portion of the gate structure using the mask structure as an etching mask, and the trench formed in the gate structure may penetrate through the gate structure along a second direction. FIGS. 4-5 illustrate schematic views of a semiconductor structure according to some embodiments of the present disclosure. Specifically, FIG. 4 illustrates a plane view of the semiconductor structure, and FIG. 5 illustrates a cross-sectional view of the semiconductor structure shown in FIG. 4 along an A-A line. It should be noted that when the trench is formed, the cross-sectional view shown in FIG. 3 is developed to the cross-sectional view shown in FIG. 5.

Referring to FIGS. 4-5, a trench 206 may be formed in the gate structure 201 after removing a portion of the gate structure 201. The trench 206 may penetrate through the gate structure 201 along a second direction. The second direction may be different from the first direction.

In one embodiment, metal residues 212 and non-metal residues 210 may be formed at the bottom of the trench 206 after removing a portion of the gate structure 201. The non-metal residues 210 may be formed when etching the sidewall spacer 204. The metal residues 212 may be formed when etching the gate layer 203.

In one embodiment, the method for forming the trench 206 may include: forming a mask structure on the dielectric 202 and the gate structure 201, such that the mask structure 207 exposes a portion of the gate structure 201; etching the gate layer 203 and the sidewall spacer 204 using the mask structure 207 as an etching mask to form the trench 206. In one embodiment, the mask structure 207 may include a first mask layer 208 and a second mask layer 209 formed on the first mask layer 208, and the first mask layer 208 and the second mask layer 209 may be made of different materials.

In one embodiment, the first mask layer 208 may be made of silicon oxycarbide including, for example, nitrogen-doped silicon oxycarbide. The first mask layer 208 made of nitrogen-doped silicon oxycarbide may have desired bonding strength with the dielectric layer 202. After the first mask layer 208 was etched and then served as an etch mask when further etching the gate structure 201, the first mask layer 208 may not easily peel off or warp. Therefore, the first masking layer 208 may have desired ability to maintain the etching pattern, which is conducive to ensuring a desired profile for the opening formed in the gate structure 201, and thus effectively improves the accuracy of the pattern after etching.

In one embodiment, the second mask layer 209 may be made of titanium nitride ($TiN_x$). With desired bonding strength between the first mask layer 208 and the second mask layer 209, the second mask layer 209 may be able to protect the surface of the first mask layer 208 when etching a to-be-etch layer in a subsequent process, such that the thickness of the first mask layer 208 may not be reduced. In addition, the physical strength of the second mask layer 208 may be desired (e.g. the second mask layer 208 may be mechanically strong), and when subsequently etching the gate structure 201, the patterns of the second mask layer 209 and the first mask layer 208 may be kept stable, which is conducive to forming an opening with a desired profile.

In other embodiments, the second mask layer may be made of silicon carbide (SiC), silicon carbonitride (SiCN), silicon oxycarbonitride (SiCON), silicon oxynitride (SiON), boron nitride (BN), boron carbonitride (BCN), or a combination thereof.

Alternatively, in other embodiments, the mask structure may be a single-layer structure, e.g. the mask structure may only include a single layer. The single-layer structure may be made of silicon nitride ($SiN_x$), silicon carbide (SiC), silicon carbonitride (SiCN), silicon oxycarbonitride (SiCON), silicon oxynitride (SiON), boron nitride (BN), boron carbonitride (BCN), or a combination thereof.

In one embodiment, the method for forming the mask structure 207 to expose a portion of the gate structure 201 may include: forming a first initial mask layer on the dielectric layer 202; forming a second initial mask layer on the first initial mask layer; forming a patterned layer (not shown) on the second initial mask layer, the patterned layer including a patterned opening that extends along the second direction and exposes a portion of the surface of the second initial mask layer; etching the second initial mask layer and the first initial mask layer using the patterned layer as an etching mask until the top surface of the dielectric layer 202 is exposed, thereby forming the second mask layer 209, the first mask layer 208, and a second opening that exposes the portion of the gate structure 201; and removing the patterned layer after the second mask layer, the first mask layer 208, and the second opening that exposes a portion of the gate structure 201 are formed.

The patterned layer may be made of a photoresist through a photolithography patterning process. Further, the patterned layer may be a removed by wet degumming process or an ashing process. When an ashing process is performed to remove the patterned layer, the processing gas used in the ashing process may be an oxygen-containing gas, such as oxygen or ozone.

In one embodiment, the first initial mask layer may be made of silicon oxycarbide including, for example, nitrogen-doped silicon oxycarbide, and the first initial mask layer may be formed by a CVD process. The processing parameters used in the CVD process may include a processing gas including $SiH_4$, $CO_2$ and $N_2O$, a gas flow rate of $SiH_4$ in a range of approximately 10 sccm to 10,000 sccm, a gas flow rate of $CO_2$ in a range of approximately 10 sccm to 10,000 sccm, a gas flow rate of $N_2O$ in a range of approximately 10 sccm to 10,000 sccm, a processing pressure in a range of approximately 0.1 Torr to 10 Torr, and a power in a range of approximately 100 W to 5000 W. $SiH_4$ gas and $CO_2$ gas may react with each other to form silicon oxycarbide (SiOC), and $N_2O$ gas may be used for in-situ doping of nitrogen ions into the silicon oxycarbide during the formation process of silicon oxycarbide. Nitrogen ions may be uniformly distributed in silicon oxycarbide, such that the performance of the formed first initial mask layer may be stable.

In one embodiment, the second initial mask layer may be formed by an ALD process. In other embodiments, the second initial mask layer may be formed by a CVD process, a PVD process, or a spin coating process.

In one embodiment, the number of the plurality of gate structures 201 formed on the substrate may be more than, and the length direction of each gate structure 201 may be parallel to the first direction.

The trench 206 may penetrate through one or more gate structures 201. In one embodiment, the trench 206 may penetrate through multiple gate structures 201.

In one embodiment, the first direction and the second direction may be perpendicular to each other. In other embodiments, the angle between the first direction and the second direction may be an acute angle or an obtuse angle.

Figure 6:
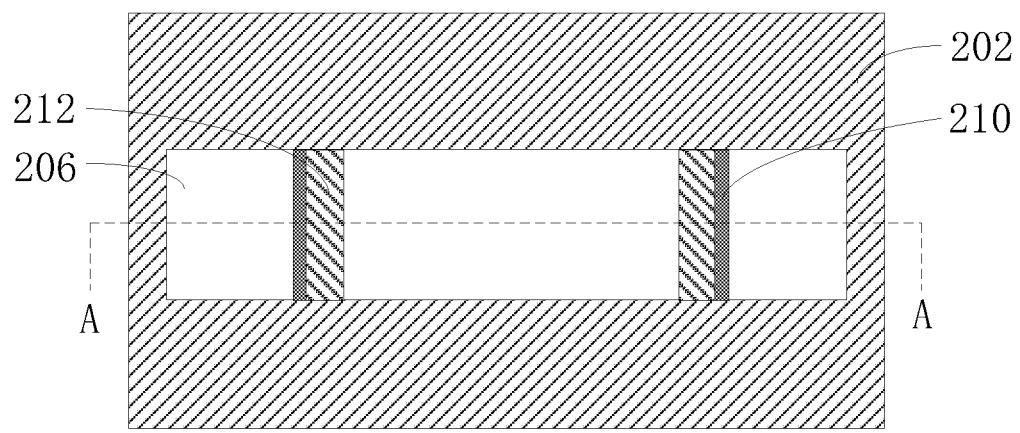
Figure 7:
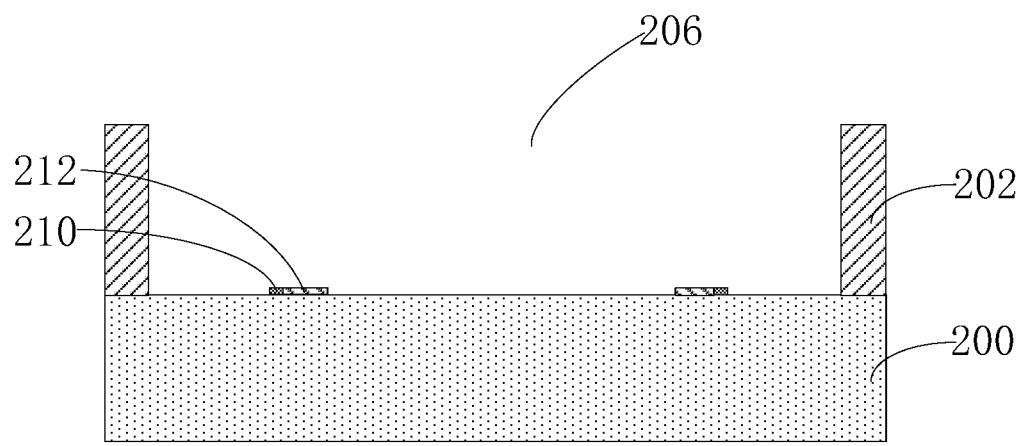

Further, returning to FIG. 13, in S604, after forming the trench, the mask structure may be removed. FIGS. 6-7 illustrate schematic views of a semiconductor structure according to some embodiments of the present disclosure. Specifically, FIG. 6 illustrates a plane view of the semiconductor structure, and FIG. 7 illustrates a schematic cross-sectional view of the semiconductor structure shown in FIG. 6 along an A-A line.

Referring to FIGS. 6-7, after forming the trench 206, the mask structure including the first mask layer 208 (referring to FIG. 5) and the second mask layer 209 (referring to FIG. 5) may be removed. The first mask layer 208 and the second mask layer 209 may be removed by a dry etching process, a wet etching process, or an etching process combining dry etching and wet etching. In one embodiment, the first mask layer 208 and the second mask layer 209 may be removed by a dry etching process.

In one embodiment, in a subsequent process, a first cleaning treatment process may be performed on the trench 206 to remove the non-metal residues 210. The first cleaning treatment process may include: performing a plasma treatment process on the trench; and performing a cleaning process on the trench after performing the plasma treatment process. In the following, detailed description of the first cleaning treatment process will be provided.

Figure 8:
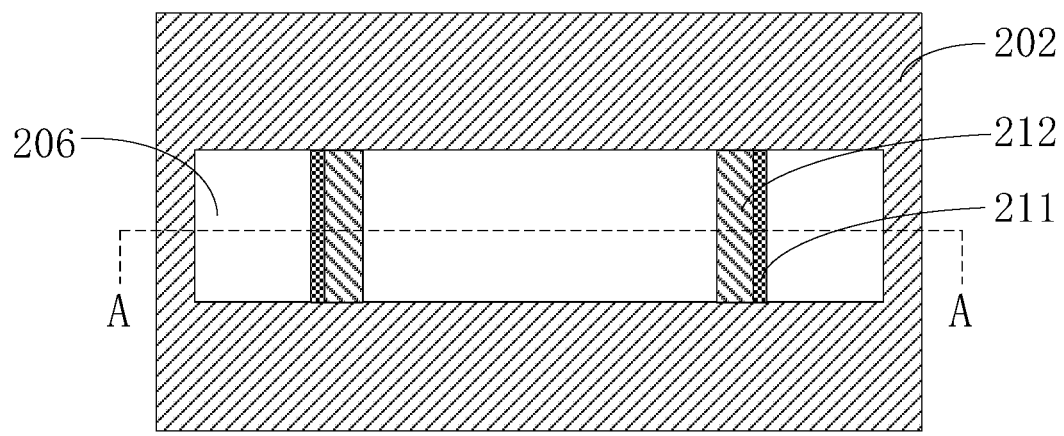
Figure 9:
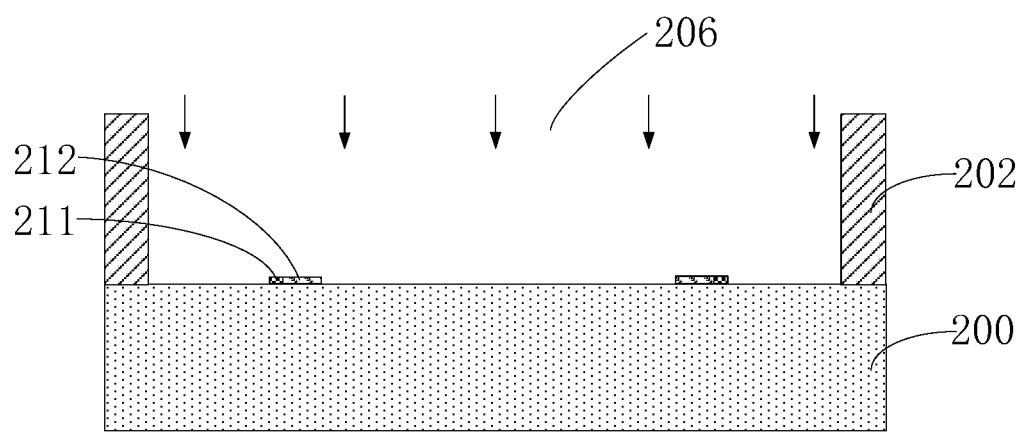

Referring to FIG. 13, in S605, a plasma treatment process may be performed on the trench. FIGS. 8-9 illustrate schematic views of a semiconductor structure according to some embodiments of the present disclosure. Specifically, FIG. 8 illustrates a plane view of the semiconductor structure, and FIG. 9 illustrates a schematic cross-sectional view of the semiconductor structure shown in FIG. 8 along an A-A line.

Referring to FIGS. 8-9, a plasma treatment process may be performed on the trench 206. The non-metal residues 210 may include nitride, oxide, or a combination thereof. In one embodiment, the non-metal residues may be nitride, and the plasma treatment process performed on the trench 206 may be able to form an intermediate product 211 from the non-metal oxide 210. That is, the plasma treatment process may convert the non-metal oxide 210 to an intermediate product 211. The processing parameters used in the plasma treatment process may include: a processing gas including hydrogen ($H_2$) or helium (He), a gas flow rate in a range of approximately 10 sccm to 1000 sccm, a power in a range of approximately 50 W to 2000 W, a bias voltage in a range of 0 V to approximately 5000 V, and a processing temperature in a range of approximately 30° C. to 150° C.

In other embodiments, the non-metal residues may be oxide. The processing parameters used in the plasma treatment process may include: a processing gas including hydrogen ($H_2$) or argon (Ar), a gas flow rate in a range of approximately 10 sccm to 1000 sccm, a power in a range of approximately 50 W to 2000 W, a bias voltage in a range of 0 V to approximately 5000 V, and a processing temperature in a range of approximately 30° C. to 150° C.

Figure 10:
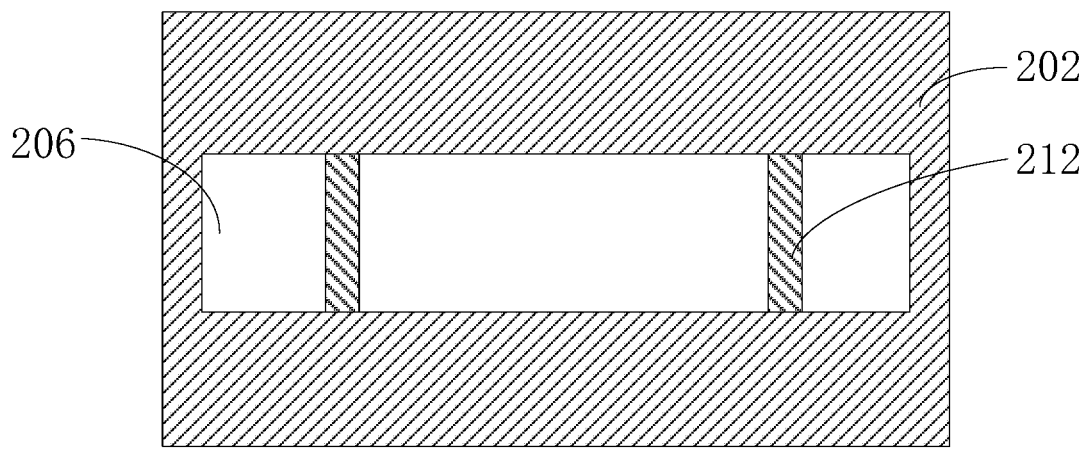

Further, returning to FIG. 13, in S606, a cleaning process may be performed on the trench to remove the intermediate product. FIG. 10 illustrates a schematic plane view of a semiconductor structure according to some embodiments of the present disclosure. It should be noted that the direction of the view shown in FIG. 10 is consistent with the direction of the view shown in FIG. 8, and thus the plane view shown in FIG. 8 is developed to the plane view shown in FIG. 10.

Referring to FIG. 10, a cleaning process may be performed on the trench 206 after the plasma treatment process. The intermediate product 211 may be removed by the cleaning process performed on the trench 206. As such, after being converted to the intermediate product 211, the non-metal residues 210 may then be removed from the semiconductor structure.

In one embodiment, the cleaning process may include a SiCoNi process, and the processing parameters used in the SiCoNi process may include: a processing gas including nitrogen trifluoride ($NF_3$) or ammonia ($NH_3$), a gas flow rate in a range of approximately 100 sccm to 2000 sccm; and a processing temperature not higher than approximately 50° C. In one embodiment, the SiCoNi process may demonstrate a desired isotropic effect in removing the intermediate product 211.

Further, returning to FIG. 13, in S607, a second cleaning treatment process may be performed on the trench to remove the metal residues. FIG. 11 illustrates a schematic plane view of a semiconductor structure according to some embodiments of the present disclosure.

Referring to FIG. 11, a second cleaning treatment process may be performed on the trench 206 to remove the metal residues 212. The second cleaning treatment process may include a dry cleaning process or a wet cleaning process. In one embodiment, the second cleaning treatment process may include a dry cleaning process, and the processing parameters used in the dry cleaning process may include a processing gas including carbon tetrafluoride ($CF_4$), sulfur hexafluoride ($SF_6$), boron trichloride ($BCl_3$), or a combination thereof; a gas flow rate in a range of approximately 5 sccm to 500 sccm; a power in a range of approximately 50 W to 1500 W; a bias voltage in a range of approximately 50 V to 2000 V; and a processing temperature not higher than approximately 150° C.

In other embodiments, the second cleaning treatment process may include a wet cleaning process, and the solution used in the wet cleaning process may include a concentrated sulfuric acid and/or hydrogen peroxide.

In one embodiment, the second cleaning treatment process may be performed after the first cleaning treatment process. By removing the non-metal residues 210 through the first cleaning treatment process, the metal residues 212 may be substantially exposed, which may be conducive to complete removal of the metal residues 212 in the subsequently performed second cleaning treatment process.

When the second cleaning treatment process is performed first to remove the metal residues 212, a portion of the metal residues 212 that is doped into the non-metal residues 210 may not be removed. Therefore, after further performing the first cleaning treatment process to remove the non-metal residues 210, the remaining portion of the metal residues 212 that is doped in the non-metal residues 210 may be exposed. Therefore, the remaining portion of the metal residues 212 may still need to be removed after the non-metal residues 210 is removed. As such, the treatment sequence may lead to an extra cleaning process, which may not only increase the processing cost, but also reduce the processing efficiency.

Further, returning to FIG. 13, in S608, an isolation layer may be formed in the trench after performing the first cleaning treatment process and the second cleaning treatment process. FIG. 12 illustrates a schematic plane view of a semiconductor structure according to some embodiments of the present disclosure.

Referring to FIG. 12, an isolation layer 213 may be formed in the trench 206 after the first cleaning treatment process and the second cleaning treatment process are completed. The purpose of forming the isolation layer 213 is to fill the groove of the trench 206 to prevent the metal residues 212 from filling the groove of the trench 206 again in subsequent processes. Otherwise, the metal residues 212 filled again in the groove of the trench 206 may cause an electric leakage problem as conductive paths are formed in the gate layer 203 between the two sides of the trench 206, and thus reduce the performance and yield of the final product.

The isolation layer 213 may be made of silicon oxide ($SiO_x$), silicon nitride ($SiN_x$), silicon oxynitride (SiON), a low-K dielectric material (low-K dielectric material refers to dielectric material with a relative dielectric constant below 3.9), an ultra-low-K dielectric material (ultra-low-K dielectric material refer to dielectric material with a relative dielectric constant below 2.5), or a combination thereof. In one embodiment, the isolation layer may be made of silicon oxide.

In one embodiment, forming the isolation layer 213 may include the following exemplary steps. For example, an initial isolation layer may be formed on the bottom surface of the trench 206, and the initial isolation layer may also cover the top surface of the dielectric layer 202. Further, the initial isolation layer may be planarized until the top surface of the dielectric layer 202 is exposed. As such, the remaining portion of the initial isolation layer may form the isolation layer 213.

The initial isolation layer may be formed by a CVD process, a PVD, an ALD process, or a spin coating process. In one embodiment, the initial isolation layer may be formed by an ALD process.

The initial isolation layer may be planarized by an etching process or a CMP process. In one embodiment, planarizing the initial isolation layer may include a CMP process.

Correspondingly, the present disclosure also provides a semiconductor structure. FIG. 11 illustrates a schematic view of a semiconductor structure according to some embodiments of the present disclosure. Referring to FIG. 11, the semiconductor structure may be formed by a method consistent with various embodiments of the present disclosure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
   providing a substrate;
   forming a gate structure on the substrate, wherein the gate structure extends along a first direction;
   removing a portion of the gate structure to form a trench in the gate structure to expose a top surface of the substrate, wherein the trench penetrates through the gate structure and extends along a second direction, and the second direction and the first direction are perpendicular to each other and in parallel to the top surface of the substrate;
   performing a first cleaning treatment process on the trench to remove non-metal residues, including:
      performing a plasma treatment process on the trench to convert a non-metal oxide to a non-metal intermediate product; and
      performing a SiCoNi process on the trench after performing the plasma treatment process to remove the non-metal intermediate product and to expose metal residues doped in the non-metal residues; and
   after performing a first cleaning treatment process, performing a second cleaning treatment process on the trench to remove the exposed metal residues immediately, including at least one of:
      performing a dry cleaning process with at least one of carbon tetrafluoride ($CF_4$), sulfur hexafluoride ($SF_6$), or boron trichloride ($BCl_3$) as a processing gas; or
      performing a wet cleaning process with a concentrated sulfuric acid or hydrogen peroxide.

2. The method according to claim 1, further including:
   forming a dielectric layer on the substrate, wherein the dielectric layer covers sidewall surfaces of the gate structure, and exposes a top surface of the gate structure.

3. The method according to claim 2, wherein:
   the gate structure includes a gate layer and a sidewall spacer formed on each sidewall surface of the gate layer.

4. The method according to claim 3, wherein the gate structure further includes:
   a gate dielectric layer formed on the substrate, wherein:
      the gate layer is disposed on the gate dielectric layer; and
      the gate dielectric layer is made of a material including a high-K dielectric material.

5. The method according to claim 3, wherein:
   the gate layer is made of a material including a metal; and
   the sidewall spacer is made of a material including silicon oxide ($SiO_x$), silicon nitride ($SiN_x$), silicon oxynitride (SiON), or a combination thereof.

6. The method according to claim 4, wherein a method for forming the dielectric layer and the gate structure includes:
   forming a dummy gate layer;
   forming the sidewall spacer on a sidewall surface of the dummy gate layer;
   forming an initial dielectric layer on the substrate, wherein the initial dielectric layer covers the dummy gate layer and the sidewall spacer;
   planarizing the initial dielectric layer until the dummy gate layer is exposed to form the dielectric layer;
   after forming the dielectric layer, removing the dummy gate layer to form a first opening;
   forming the gate dielectric layer on a bottom surface of the first opening; and
   forming the gate layer on the gate dielectric layer.

7. The method according to claim 3, wherein forming the trench includes:
   forming a mask structure on the dielectric layer and the gate structure, wherein the mask structure exposes a portion of the gate structure; and
   etching the gate layer and the sidewall spacer using the mask structure as an etch mask to form the trench.

8. The method according to claim 7, wherein:
   the mask structure includes a first mask layer and a second mask layer disposed on the first mask layer; and
   the first mask layer and the second mask layer are made of different materials.

9. The method according to claim 8, wherein:
   the first mask layer is made of nitrogen-doped silicon oxycarbide; and
   the second mask layer is made of titanium nitride (TiN), silicon carbide (SiC), silicon carbonitride (SiCN), silicon oxycarbonitride (SiCON), silicon oxynitride (SiON), boron nitride (BN), boron carbonitride (BCN), or a combination thereof.

10. The method according to claim 1, wherein:
when forming the gate structure on the substrate, more than one gate structures are formed on the substrate, wherein each gate structure extends along the first direction, and
the trench penetrates through at least two gate structures.

11. The method according to claim 7, wherein:
etching the sidewall spacer generates non-metal residues, including nitride, oxide, or a combination thereof; and
etching the gate layer generates metal residues.

12. The method according to claim 1, wherein processing parameters used in the plasma treatment process include:
a processing gas including hydrogen ($H_2$) or helium (He) or argon (Ar);
a gas flow rate in a range of approximately 10 sccm to 1000 sccm;
a power in a range of approximately 50 W to 2000 W;
a bias voltage in a range of 0 V to approximately 5000 V; and
a processing temperature in a range of approximately 30° C. to 150° C.

13. The method according to claim 1, wherein: the cleaning process includes a SiCoNi process; and processing parameters used in the SiCoNi process include: a processing gas including nitrogen trifluoride (NF3) or ammonia (NH3), a gas flow rate in a range of approximately 100 sccm to 2000 sccm, and a processing temperature not higher than approximately 50° C.

14. The method according to claim 1, wherein:
the second cleaning treatment process includes a dry cleaning process or a wet cleaning process.

15. The method according to claim 1, wherein:
the second cleaning treatment process includes a dry cleaning process; and processing parameters used in the dry cleaning process include: a processing gas including carbon tetrafluoride (CF4), sulfur hexafluoride (SF6), boron trichloride (BCl3), or a combination thereof, a gas flow rate in a range of approximately 5 sccm to 500 sccm, a power in a range of approximately 50 W to 1500 W, a bias voltage in a range of approximately 50 V to 2000 V, and a processing temperature not higher than approximately 150° C.

16. The method according to claim 14, wherein:
a solution used in the wet cleaning process is a concentrated sulfuric acid and/or hydrogen peroxide.

17. The method according to claim 1, wherein:
the second cleaning treatment process is performed after the first cleaning treatment process.

18. The method according to claim 1, after performing the first cleaning treatment process and the second cleaning treatment process, further including:
forming an isolation layer in the trench, wherein the isolation layer is made of a material including silicon oxide, silicon nitride, a low-K dielectric material, an ultra-low-K dielectric material, or a combination thereof.

19. A semiconductor structure formed by the method according to claim 1.

* * * * *